United States Patent
Takemura

(10) Patent No.: US 10,326,407 B2
(45) Date of Patent: Jun. 18, 2019

(54) MUSIC REPRODUCING DEVICE

(71) Applicant: Onkyo Corporation, Neyagawa-shi (JP)

(72) Inventor: Susumu Takemura, Neyagawa (JP)

(73) Assignee: Onkyo Corporation, Osaka (JP)

( * ) Notice: Subject to any disclaimer, the term of this patent is extended or adjusted under 35 U.S.C. 154(b) by 24 days.

(21) Appl. No.: 15/879,106

(22) Filed: Jan. 24, 2018

(65) Prior Publication Data

US 2018/0367102 A1  Dec. 20, 2018

(30) Foreign Application Priority Data

Jun. 14, 2017  (JP) ................................ 2017-116511

(51) Int. Cl.
*H04R 3/00* (2006.01)
*H03F 1/02* (2006.01)
*H03F 3/45* (2006.01)
*H03F 3/68* (2006.01)
*H03F 3/183* (2006.01)
*H03F 3/187* (2006.01)

(52) U.S. Cl.
CPC .......... *H03F 1/0227* (2013.01); *H03F 3/183* (2013.01); *H03F 3/187* (2013.01); *H03F 3/45475* (2013.01); *H03F 3/68* (2013.01); *H04R 3/002* (2013.01); *H03F 2200/03* (2013.01)

(58) Field of Classification Search
CPC ............................. H04R 5/04; H04R 2420/05
See application file for complete search history.

(56) References Cited

U.S. PATENT DOCUMENTS

| 3,051,788 | A | * | 8/1962 | Seeley | ...................... | H03F 1/54 330/124 D |
| 3,939,435 | A | * | 2/1976 | Suzuki | ................... | H03F 3/211 330/51 |
| 6,934,396 | B1 | * | 8/2005 | Leapman | ................. | H04R 5/04 381/58 |

FOREIGN PATENT DOCUMENTS

| JP | 63234706 A | * | 9/1988 |
| JP | 2013-5291 A |   | 1/2013 |

* cited by examiner

*Primary Examiner* — Duc Nguyen
*Assistant Examiner* — Kile O Blair
(74) *Attorney, Agent, or Firm* — Xsensus, LLP

(57) ABSTRACT

A music reproducing device configured to have a balanced output and an unbalanced output, comprising: a first amplification circuit configured to amplify an audio signal, a second amplification circuit configured to amplify an inverted audio signal that the audio signal is inverted, a balanced output jack to which the audio signal which is amplified by the first amplification circuit and the inverted audio signal which is amplified by the second amplification circuit are output, an unbalanced output jack to which the audio signal which is amplified by the first amplification circuit is output, and circuitry configured to mute input of the second amplification circuit when plugs are connected to the balanced output jack and the unbalanced output jack.

5 Claims, 4 Drawing Sheets

MUSIC REPRODUCING DEVICE

CROSS-REFERENCE TO RELATED APPLICATIONS

This application claims priority to Japanese Application No. 2017-116511, filed Jun. 14, 2017, the entire contents of which are incorporated herein by reference.

FIELD

The present disclosure relates to a music reproducing device which has a balanced output and an unbalanced output.

BACKGROUND

In an unbalanced output, a three-pole terminal with a diameter of 3.5 mm is used, and an audio signal is transmitted by two kinds of "hot" and "cold". Meanwhile, in a balanced output, a four-pole terminal with a diameter of 2.5 mm is used, and an audio signal is transmitted by two kinds of "positive" and "negative" (for example, see JP 2013-005291 A). "Negative" is opposite phase of "positive". By inverting phase of "negative" and mixing inverted "negative" signal with "positive" signal, amplitude of audio signal becomes twice. Further, ground potential is stable, and sound quality can be improved because output current does not flow to ground.

An applicant files JP 2015-171945 in Japan. FIG. 3 is a diagram illustrating a circuit configuration of a digital audio player according to JP 2015-171945. As illustrated in FIG. 3, the digital audio player includes DACs (D/A converters) 107 and 108, amplification circuits 109 and 110, a DC/DC converter 113, linear regulators 114 and 115, a balanced output jack 116 and an unbalanced output jack 117.

The DC/DC converter 113 boosts voltage which is supplied from a battery and supplies boosted voltage to the linear regulators 114 and 115. The linear regulator 114 supplies power supply voltage to the DAC 107 and the amplification circuit 109. The linear regulator 115 supplies power supply voltage to the DAC 108 and the amplification circuit 110.

LR 2 channel digital audio data of I2S system is input to the positive side DAC 107 (for a non-inverted signal). The DAC 107 D/A-converts the LR 2 channel digital audio data into LR 2 channel analog audio data. The positive side amplification circuit 109 amplifies the LR 2 channel analog audio data which is D/A converted by the DAC 107. The amplification circuit 109 includes two amplifiers 118 and 119. The amplifier 118 amplifies L channel analog audio data. The amplifier 119 amplifies R channel analog audio data. The analog audio data which is amplified by the amplification circuit 109 is output to the balanced output jack 116 and the unbalanced output jack 117.

The LR 2 channel digital audio data of I2S system is input to the negative side DAC 108 (for an inverted signal). The DAC 108 D/A-converts the LR 2 channel digital audio data into the LR 2 channel analog audio data. LR 2 channel inverted analog audio data that the LR 2 channel analog audio data which is D/A-converted by the DAC 108 is inverted is input to the negative side amplification circuit 110. The amplification circuit 110 amplifies the LR 2 channel inverted analog audio data. The amplification circuit 110 includes two amplifiers 120 and 121. The amplifier 120 amplifies L channel inverted analog audio data. The amplifier 121 amplifies R channel inverted analog audio data. The inverted analog audio data which is amplified by the amplification circuit 110 is output to the balanced output jack 116.

In case of the balanced output, an SoC (System on a Chip) supplies power supply voltage from the linear regulator 114 to the DAC 107 and the amplification circuit 109. Further, the SoC supplies power supply voltage from the linear regulator 115 to the DAC 108 and the amplification circuit 109. In case of the unbalanced output, the SoC supplies power supply voltage from the linear regulator 114 to the DAC 107 and the amplification circuit 109. Meanwhile, the SoC shuts down the linear regulator 115. For this reason, the linear regulator 115, the DAC 108, and the amplification circuit 110 shut down.

In case that the circuit which is illustrated in FIG. 3 is applied to a mobile phone, when headphones are connected to the balanced output jack and the unbalanced output jack, if call arrives, a problem occurs. This is because a positive side circuit is used to the balanced output and the unbalanced output commonly. FIG. 4 is a diagram for describing a problem which occurs in case where the circuit which is illustrated in FIG. 3 is applied to the mobile phone. In case of the unbalanced output, as illustrated in FIG. 4, the negative side amplification circuit 110 is an OFF state. In this state, if current is output from the positive side amplification circuit 109, balanced load current flows to the negative side amplification circuit 110 which becomes OFF, and it is possible that the negative side amplification circuit 110 damages. In case that the headphones are connected to the balanced output jack and the unbalanced output jack, it is thought that an audio is output from the speaker. However, it is normal that the audio is output from the headphones because the headphones are connected.

SUMMARY

According to one aspect of the disclosure, there is provided a music reproducing device configured to have a balanced output and an unbalanced output, comprising: a first amplification circuit configured to amplify an audio signal, a second amplification circuit configured to amplify an inverted audio signal that the audio signal is inverted, a balanced output jack to which the audio signal which is amplified by the first amplification circuit and the inverted audio signal which is amplified by the second amplification circuit are output, an unbalanced output jack to which the audio signal which is amplified by the first amplification circuit is output, and circuitry configured to mute input of the second amplification circuit when plugs are connected to the balanced output jack and the unbalanced output jack.

DETAILED DESCRIPTION

An objective of the present disclosure is that an audio is output from a headphone and so on without damaging a negative side amplification circuit even if the headphone and so on are connected to a balanced output jack and an unbalanced output jack in a music reproducing device which has a balanced output and an balanced output. According to the present disclosure, the audio can be output from the headphone and so on without damaging the negative side second amplification circuit (for an inverted signal) even if plugs of the headphones so on are connected to the balanced output jack and the unbalanced output jack.

Figure 1:
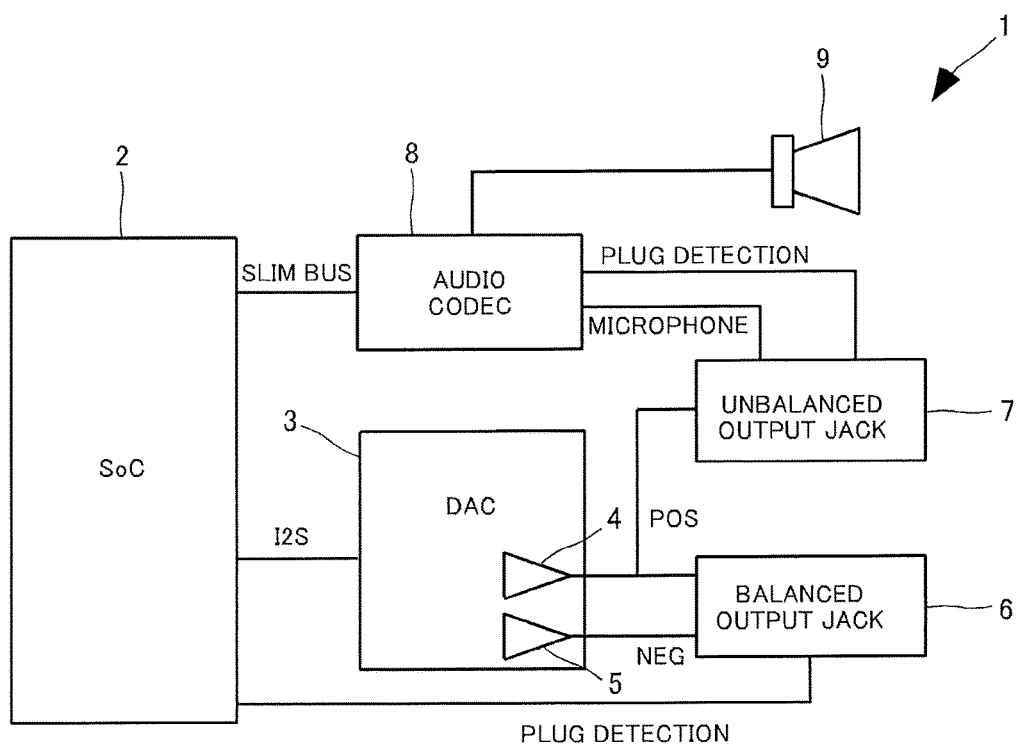
FIG. 1 is a block diagram illustrating a configuration of a mobile phone according to an embodiment of the present disclosure.

An embodiment of the present disclosure is described below. FIG. 1 is a block diagram illustrating a configuration of a mobile phone according to an embodiment of the present disclosure. The mobile phone 1 (music reproducing device) includes an SoC 2, a D/A converter (hereinafter, referred as to "DAC") 3, amplification circuits 4 and 5, a balanced output jack 6, an unbalanced output jack 7, an audio codec 8, and a speaker 9. In the present embodiment, audio output of the mobile phone 1 is described and description of call function, communication function and so on is omitted. For this reason, in FIG. 1, a configuration which relates to the call function, the communication function and so on is omitted. The mobile phone 1 according to the present embodiment is a so-called smart phone.

The SoC 2 (controller) has a CPU (Central Processing Unit), a DSP (Digital Signal Processor), a memory and so on, and controls respective sections composing the mobile phone 1.

LR (left and right) 2 channel digital audio data of I2S system (digital audio signal) is input to the DAC 3 from the SoC 2. The DAC 3 D/A-converts the LR 2 channel digital audio data into LR 2 channel analog audio data (analog audio signal). The LR 2 channel analog audio data which is D/A-converted by the DAC 3 is input to the positive side amplification circuit 4 (for a non-inverted signal) (first amplification circuit). The amplification circuit 4 amplifies the LR 2 channel analog audio data. The LR 2 channel analog audio data which is amplified by the amplification circuit 4 is output to the balanced output jack 6 and the unbalanced output jack 7.

LR 2 channel inverted analog audio data that the LR 2 channel analog audio data which is D/A converted by the DAC 3 is inverted is input to the negative side amplification circuit 5 (for an inverted signal) (second amplification circuit). The amplification circuit 5 amplifies the LR 2 channel inverted analog audio data. The LR 2 channel inverted analog audio data which is amplified by the amplification circuit 5 is output to the balanced output jack 6. A headphone plug for balanced is connected to the balanced output jack 6. A headphone plug for unbalanced is connected to the unbalanced output jack 7. A headphone outputs an audio based on input analog audio data.

The audio codec 8 encodes or decodes audio data. The audio data is input to the audio codec 8 from the SoC 2 by a slim bus. The unbalanced output jack 7 includes a switch for headphone plug insertion/extraction detection and the switch is connected to headphone plug insertion detection input of the audio codec 8. Further, a microphone input pin of the unbalanced output jack 7 is a microphone input of the audio codec 8, the balanced output jack 6 includes a switch for headphone plug insertion detection, and the switch is connected to general purpose digital input pin of the SoC 2.

Figure 2:
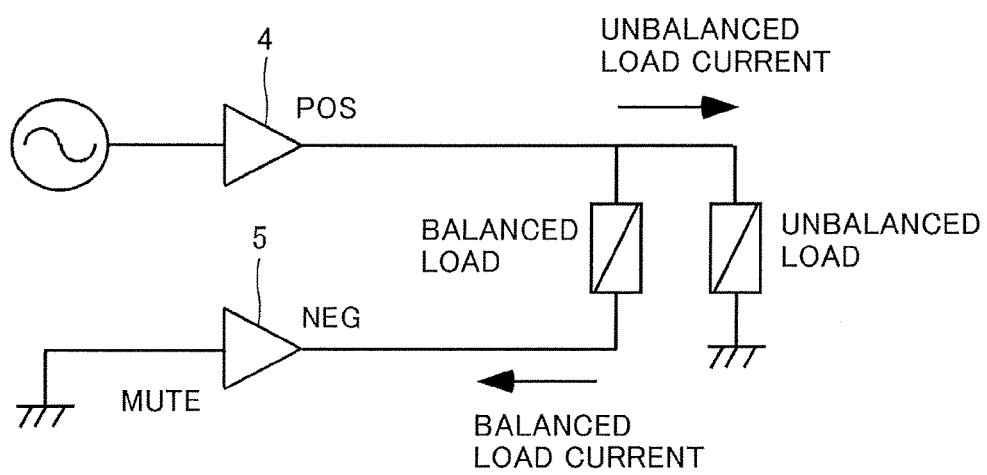
FIG. 2 is a diagram for describing operation of the mobile phone in case where headphone plugs are connected to a balanced output jack and an unbalanced output jack.
Figure 3:
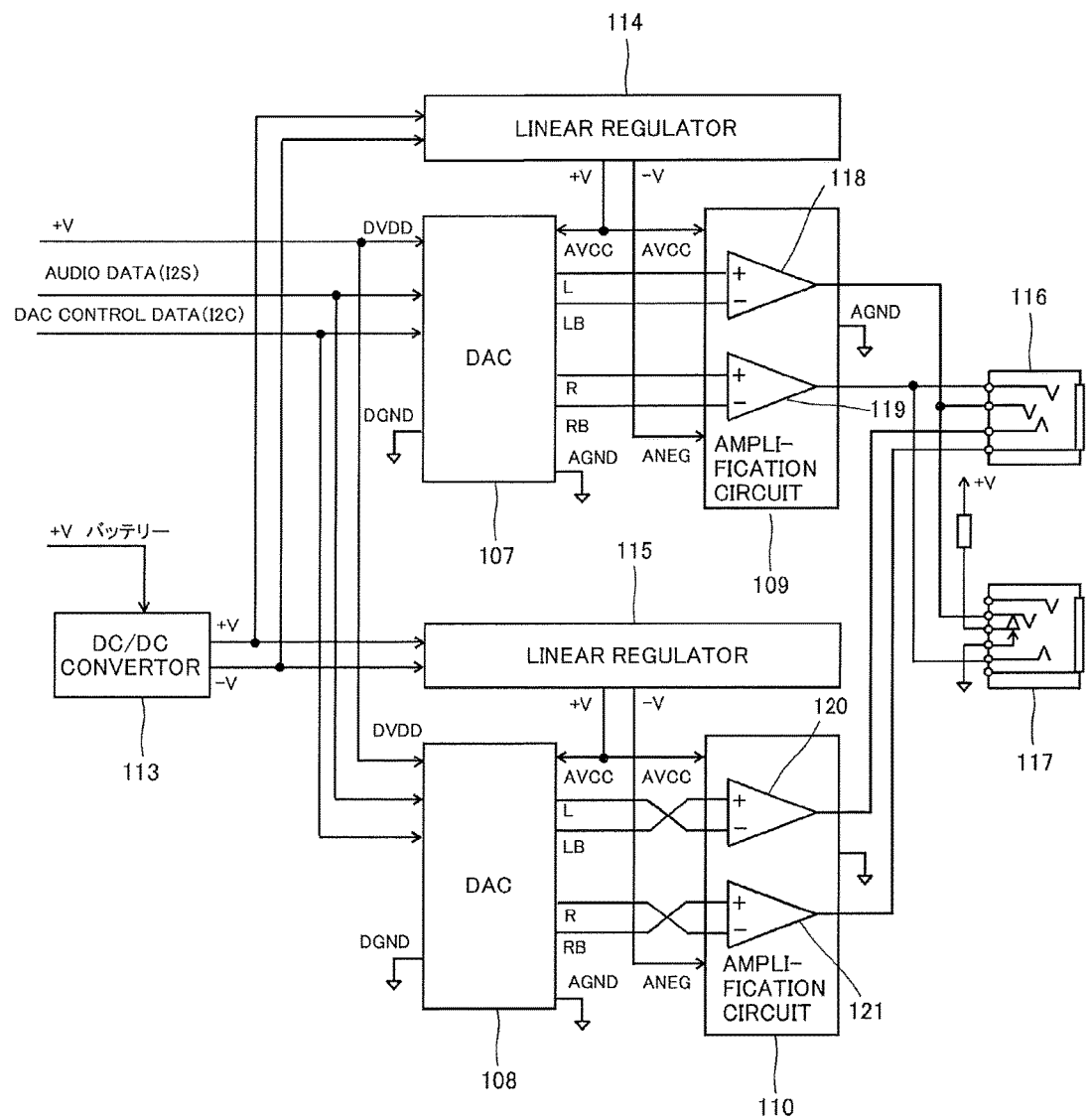
FIG. 3 is a diagram illustrating a circuit configuration of a digital audio player.
Figure 4:
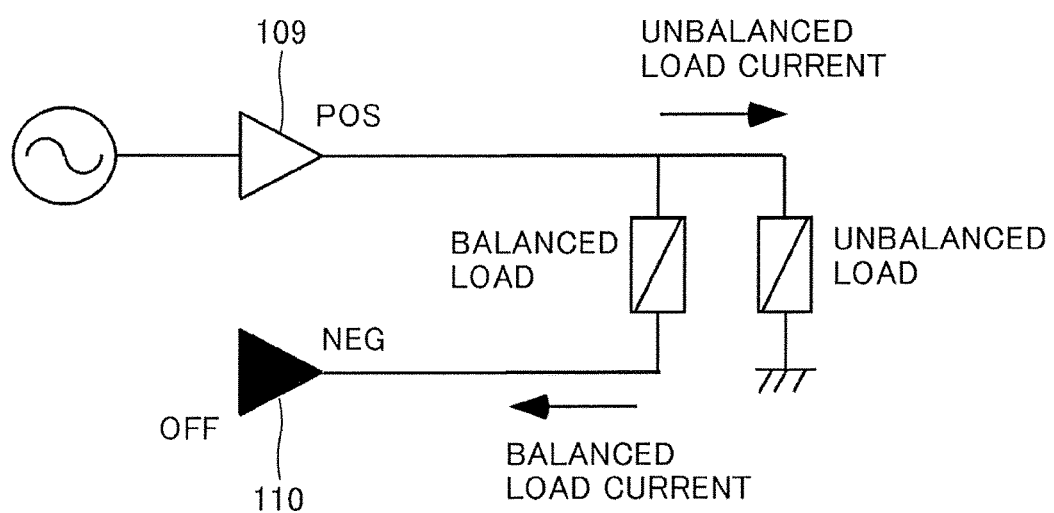
FIG. 4 is a diagram for describing a problem which occurs in case where a circuit which is illustrated in FIG. 3 is applied to a mobile phone.

FIG. 2 is a diagram for describing operation of the mobile phone 1 in case where headphone plugs are connected to the balanced output jack 6 and the unbalanced output jack 7. As illustrated in FIG. 2, when the headphone plugs are connected to the balanced output jack 6 and the unbalanced output jack 7, the SoC 2 mutes input of the negative side amplification circuit 5. For this reason, output of the amplification circuit 5 becomes ground potential. Output current of the positive side amplification circuit 4 becomes large because current which flows to the load becomes twice in general balanced output. To prevent this, when the headphone plugs are connected to the balanced output jack 6 and the unbalanced output jack 7, the SoC 2 mutes input of the negative side amplification circuit 5.

Herein, a state that the headphone plugs are connected to the balanced output jack 6 and the unbalanced output jack 7 is an abnormal state. For this reason, when the headphone plugs are connected to the balanced output jack 6 and the unbalanced output jack 7, a caution message is displayed on a display section which is not illustrated. The caution message is a message such as "headphones are connected to both of the balanced output jack and the unbalanced output jack.", for example.

Further, when the headphone plugs are connected to the balanced output jack 6 and the unbalanced output jack 7, the SoC 2 decreases volume. Concretely, the SoC 2 decreases volume by 6 dB.

As described above, in the present embodiment, when the headphone plugs are connected to the balanced output jack 6 and the unbalanced output jack 7, the SoC 2 mutes input of the negative side amplification circuit 5 (for the inverted signal). For this reason, output of the amplification circuit 5 becomes ground potential. Therefore, even if the headphone plugs are connected to the balanced output jack 6 and the unbalanced output jack 7, audio can be output from the headphone without damaging the negative side amplification circuit 5.

Further, in the present embodiment, when the headphone plugs are connected to the balanced output jack 6 and the unbalanced output jack 7, the SoC 2 displays a caution message on the display section. Thus, a user can understand abnormal state by confirming display.

Further, in the present embodiment, when the headphone plugs are connected to the balanced output jack 6 and the unbalanced output jack 7, the SoC 2 decreases volume. Thus, the user can understand abnormal state because volume becomes small.

The embodiment of the present disclosure is described above, but the mode to which the present disclosure is applicable is not limited to the above embodiment and can be suitably varied without departing from the scope of the present disclosure.

In the above described embodiment, when the headphone plugs are connected to the balanced output jack 6 and the unbalanced output jack 7, the SoC 2 informs a caution message by displaying the caution message on the display section. Not limited to this, a caution message may be informed by an audio.

The present disclosure can be suitably employed in a music reproducing device which has a balanced output and an unbalanced output.

The invention clamed is:
1. A music reproducing device configured to have a balanced output and an unbalanced output, comprising:
   a first amplification circuit configured to amplify a LR 2 channel audio signal;
   a second amplification circuit configured to amplify an inverted LR 2 channel audio signal that the LR 2 channel audio signal is inverted;
   a balanced output jack to which the LR 2 channel audio signal which is amplified by the first amplification circuit and the inverted LR 2 channel audio signal which is amplified by the second amplification circuit are output;

an unbalanced output jack to which the LR 2 channel audio signal which is amplified by the first amplification circuit is output; and circuitry configured to:
   receive a first plug detection signal indicating a first plug is connected to the balanced output jack;
   receive a second plug detection signal indicating a second plug is connected to the unbalanced output jack;
   determine whether both the first plug and the second plug are connected to the balanced output jack and the unbalanced output jack respectively based on the first plug detection signal and the second plug detection signal; and
   mute input of the second amplification circuit in response to determining that both the first plug and the second plug are connected to the balanced output jack and the unbalanced output jack respectively.

2. The music reproducing device according to claim 1, wherein
   the circuitry is configured to inform a caution message in response to the both plugs being connected to the balanced output jack and the unbalanced output jack respectively.

3. The music reproducing device according to claim 2, wherein
   the circuitry is configured to inform the caution message by displaying the caution message in response to the both plugs being connected to the balanced output jack and the unbalanced output jack respectively.

4. The music reproducing device according to claim 1, wherein
   the circuitry is configured to decrease volume in response to the both plugs being connected to the balanced output jack and the unbalanced output jack respectively.

5. The music reproducing device according to claim 1, wherein
   the circuitry is configured to mute the input of the second amplification circuit such that output of the second amplification circuit becomes ground potential.

* * * * *